(12) United States Patent
Cheng

(10) Patent No.: US 7,699,547 B2
(45) Date of Patent: Apr. 20, 2010

(54) COMPACT CAMERA MODULE

(75) Inventor: Ming-Hsiang Cheng, Kao-Hsiung (TW)

(73) Assignee: Advanced Semiconductor Engineering, Inc., Nantze Export Processing Zone, Kao-Hsiung (TW)

( * ) Notice: Subject to any disclaimer, the term of this patent is extended or adjusted under 35 U.S.C. 154(b) by 725 days.

(21) Appl. No.: 11/562,971

(22) Filed: Nov. 22, 2006

(65) Prior Publication Data

US 2007/0158773 A1 Jul. 12, 2007

(30) Foreign Application Priority Data

Dec. 30, 2005 (TW) ............................. 94147749 A

(51) Int. Cl.
*G03B 17/02* (2006.01)
*H04N 5/225* (2006.01)
(52) U.S. Cl. .................... 396/529; 396/535; 348/374; 257/433
(58) Field of Classification Search ................. 396/529; 257/433
See application file for complete search history.

(56) References Cited

U.S. PATENT DOCUMENTS

| 5,098,630 | A | 3/1992 | Ogiu et al. |
| 5,400,072 | A | 3/1995 | Izumi et al. |
| 5,821,532 | A | 10/1998 | Beaman et al. |
| 5,865,935 | A | 2/1999 | Ozimek et al. |
| 7,012,315 | B1* | 3/2006 | Campbell .................... 257/433 |
| 7,084,391 | B1* | 8/2006 | Chen .......................... 250/239 |
| 2004/0095502 | A1* | 5/2004 | Losehand et al. ........... 348/340 |
| 2006/0035415 | A1* | 2/2006 | Wood et al. ................. 438/125 |

* cited by examiner

*Primary Examiner*—W. B. Perkey
*Assistant Examiner*—Dennis Hancock
(74) *Attorney, Agent, or Firm*—Winston Hsu

(57) ABSTRACT

A compact camera module mainly includes an image sensor chip, a module case and a lens module. The image sensor chip has an active surface, a back surface and a plurality of side surfaces, wherein a sensor region is formed in the active surface. A plurality of lateral contact fingers is formed on the side surfaces. The image sensor chip is plugged in a cave of the module case, a plurality of electrically contact components disposed on inside walls of the cave electrically connect the lateral contacting fingers. The lens module is mounted on the module case to seal the image sensor chip. Because the electrically contact components can replace the bonding wires to electrically connect the lateral contacting fingers, the compact camera module can be reworked and tiny.

8 Claims, 8 Drawing Sheets

COMPACT CAMERA MODULE

BACKGROUND OF THE INVENTION

1. Field of the Invention

The invention relates to a compact camera module, and more particularly, to a compact camera module which comprises reworking efficiency.

2. Description of the Prior Art

Due to the consumption trends that the idealism of electronic devices, such as cellular phones, is light, handy and thin, the development of compact camera modules (CCM), in the electronic devices tends to minimize the size of CCMs. However, in the image sensor module according to the prior art, bonding wires formed by wiring are used to electronically connect the substrate and the image sensor chip, which requires spaces reserved for wiring on the surface of the substrate. Therefore, the size of CCMs cannot be minimized.

Please refer to FIG. 1. A prior-art CCM 100 comprises a substrate 110, an image sensor chip 120, a plurality of bonding wires 130, and a lens module 140. The substrate 110 comprises an upper surface 111 and a plurality of connecting pads 112. The image sensor chip 120 is installed on the upper surface 111 of the substrate 110. The image sensor chip 120 comprises an active surface 121 and a back surface 122, and a plurality of bonding pads 123 are formed on the active surface 121. The back surface 122 of the image sensor chip 120 is mounted on the substrate 110 by tapes or die bonding materials. The bonding wires 130 formed by wiring electronically connect the connecting pads 112 of the substrate 110 and the bonding pads 123 of the image sensor chip 120. The lens module 140 is mounted with the substrate 110, which air locks and seals the image sensor chip 120 and the bonding wires 130 to form the CCM 100. Wherein, the lens module 140 comprises a filter 141 and a lens combination base 142. The lens combination base 142 of the lens module 140 comprises a lens container 143. A lens 144 is installed in the lens container 143.

Since the CCM 100 is tested after the fabrication is complete, the bonding wires 130 and the image sensor chip 120 have to be removed if the CCM 100 turns out to be defective, which may cause the damage on the connecting pads 112 of the substrate 110 and the bonding pads 123 of the image sensor chip 120, and which may also cause the substrate 110 and the image sensor chip 120 unusable and increase the cost of manufacture.

SUMMARY OF THE INVENTION

The primary objective of the claimed invention is to provide a compact camera module, CCM, and a method for fabricating the same. A compact camera module mainly comprises an image sensor chip, a module case and a lens module. The image sensor chip comprises an active surface, a back surface, and a plurality of side surfaces. A plurality of lateral contacting fingers is formed on the side surfaces. The lateral contacting fingers is electrically connected to a plurality of bonding pads of the image sensor chip. The module case comprises a cave where the image sensor chip is plugged. A plurality of electrically contact components are disposed on an inside wall of the cave for electrically connecting the lateral contacting fingers. The lateral contacting fingers and the electrically contact components are used to replace the bonding wire in prior-art to electrically connect the image sensor chip and the substrate in expectation of improving the waste space of the substrate surface and enabling the minimization and reworking efficiency of the CCM.

The secondary objective of the claimed invention is to provide a CCM and method for fabricating the same, wherein the module case comprises a plurality of external guides formed on one external wall of the module case to improve the electrically connection between the CCM and other external electronic components.

According to the claimed invention, a CCM mainly comprises an image sensor chip, a module case, and a lens module. The image sensor chip comprises an active surface, a back surface, and a plurality of side surfaces between the active surface and the back surface. A sensor region is formed on the active surface. A plurality of lateral contacting fingers are formed on the side surfaces and electrically connected to a plurality of bonding pads of the image sensor chip. The module case comprises a cave for containing the image sensor chip. A plurality of electrically contact components installed on an inside wall of the cave are electrically connected to the lateral contacting fingers of the image sensor chip. The lens module is mounted with the module case to seal the image sensor chip.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
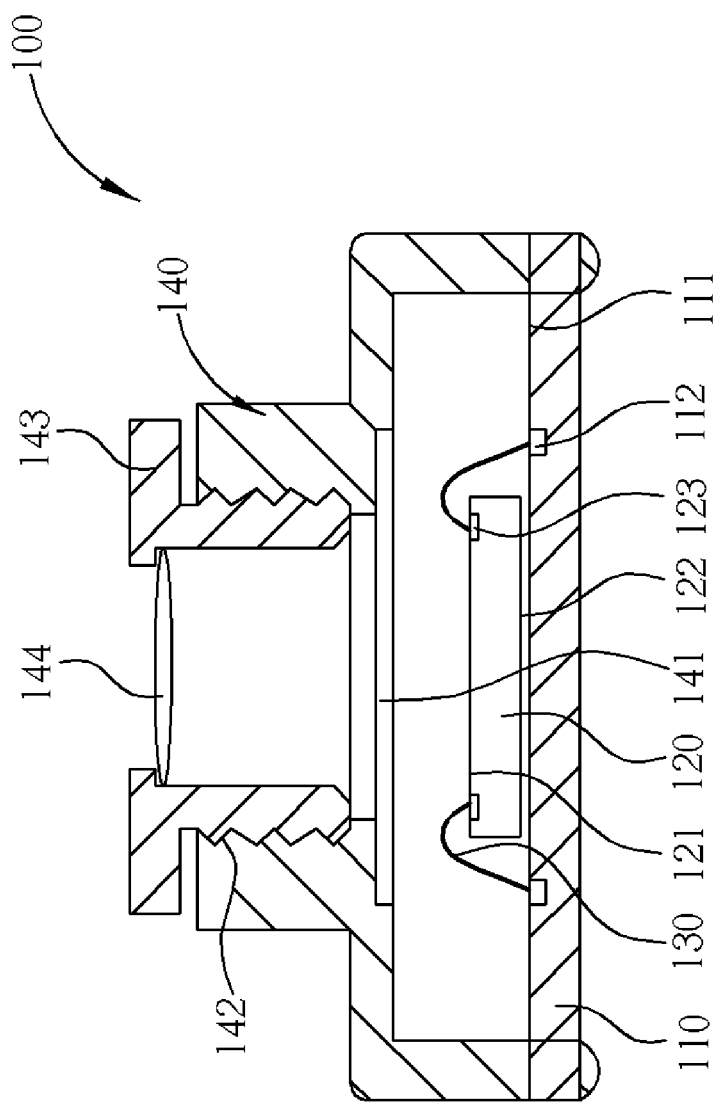
FIG. 1 is a cross-section schematic diagram of a CCM according to the prior art.
Figure 2:
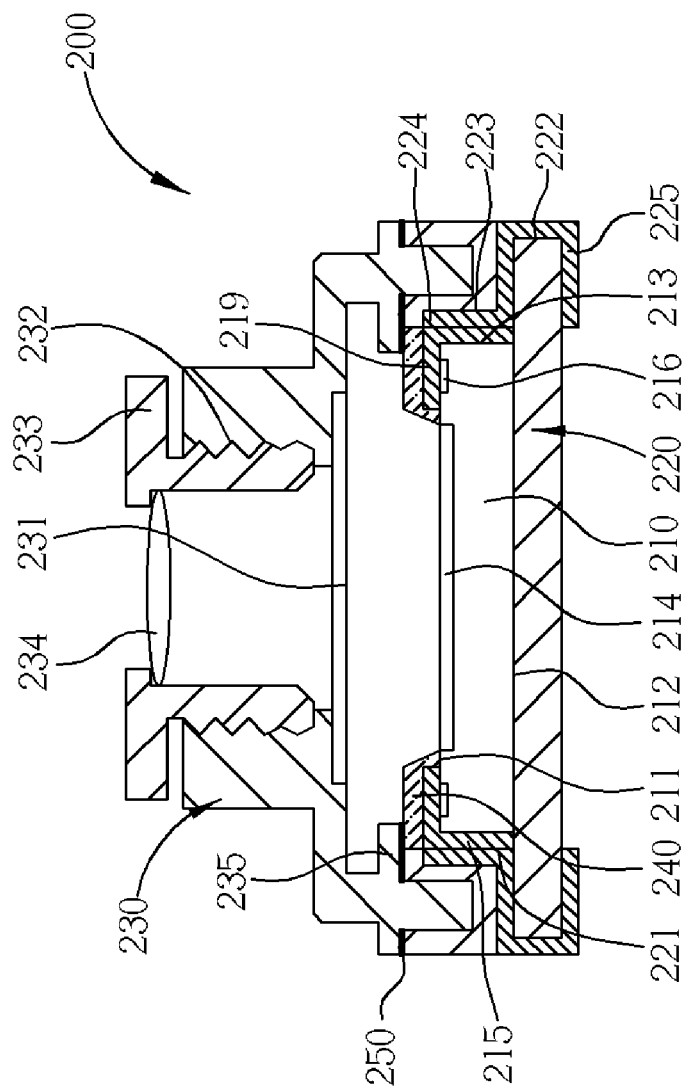
FIG. 2 is a cross-section schematic diagram of a CCM according to an embodiment of the present invention.
Figure 3:
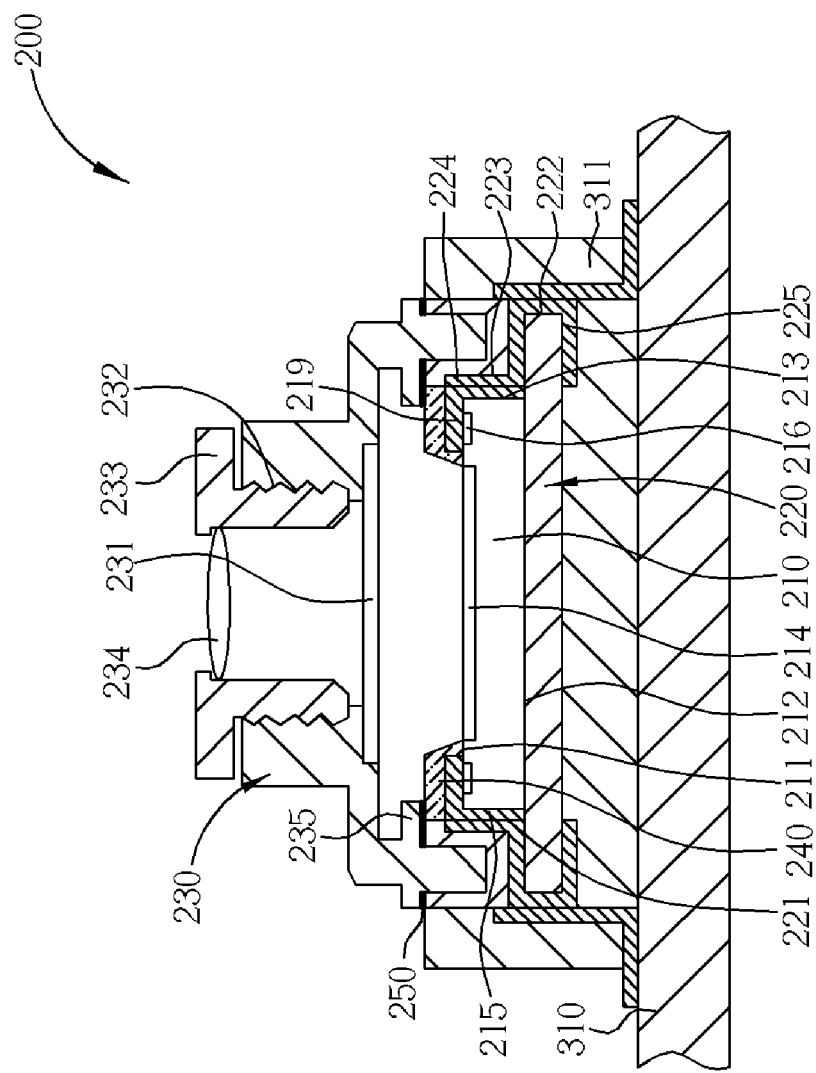
FIG. 3 is a cross-section schematic diagram of a CCM connecting to a binding cave according to an embodiment of the present invention.

Please refer to FIG. 2. A CCM 200 according to an embodiment of the present invention mainly comprises an image sensor chip 210, a module case 220, and a lens module 230. The image sensor chip 210 comprises an active surface 211, a back surface 212, and a plurality of side surfaces 213 positioned between the active surface 211 and the back surface 212. A sensor region 214 is formed on the active surface 211. A plurality of lateral contacting fingers 215 is formed on the side surfaces 213. The lateral contacting fingers 215 are connected to a plurality of bonding pads 216 of the image sensor chip 210. In this embodiment, a redistribution wire layer 219 is formed on the active surface 211 of the image sensor chip 210. The lateral contacting fingers 215 are connected to the bonding pads 216 of the image sensor chip 210 by the redistribution wire layer 219. The redistribution wire layer 219 may be fabricated with the technology of the wafer-level redistribution wire process. According to this embodiment, a protective layer 240 covers the active surface 211 of the image sensor chip 210 to protect the redistribution wire layer 219 on the active surface 211. The protective layer 240 also exposes the sensor region 214. The module case 220 comprises a cave 221. The image sensor chip 210 is plugged in the cave 221. A plurality of electrically contact components 224 is installed on one inside wall 223 of the cave 221. According to this embodiment, the electrically contact components 224 have elasticity, such as an elastic reed. The electrically contact components 224 elastically contact the lateral contacting fingers 215, so that the image sensor chip 210 may be repeatedly plugged in and removed from the cave 221 without damaging the image sensor chip 210 and the electrically connection is also achieved between the image sensor chip 210 and the module case 220. When the image sensor chip 210 is plugged in the cave 221, the electrically contact components 224 elastically contact the lateral contacting fingers 215 of the image sensor chip 210 to electrically connect the image sensor chip 210 and the module case 220. The lens module 230 is mounted with the module case 220 to seal the image sensor chip 210. Usually the lens module 230 comprises a filter 231 and a lens combination base 232, wherein the lens combination base 232 of the lens module 230 comprises a lens container 233, and a lens 234 is installed in the lens container 233. According to this embodiment, the lens module 230 comprises a stopper 235, which is used to prevent the image sensor chip 210 in the cave 221 from disengaging from the cave 221. The combination between the lens module 230 and the module case 220 may be made by engaging, screwing, or gluing methods. In this embodiment, an airtight rubber ring 250 is disposed between the lens module 230 and the module case 220 to increase the seal between the lens module 230 and the module case 220 and also to prevent the stopper 235 from crushing the image sensor chip 210. In addition, the module case 220 further comprises a plurality of external guiding elements 225. These external guiding elements 225 are formed on at least one external sidewall 222 of the module case 220. The electrically contact components 224 may be monolithically integrated with the external guides 225 on the module case 220 by electroplating or other methods, or the electrically contact components 224 and the external guides 225 may be formed on the module case 220 separately. Please refer to FIG. 3. The CCM 200 may be plugged in a binding cave 311 of a printed circuit board 310. The CCM 200 comprises rework efficiency and may be repeatedly plugged in and removed from the binding cave 311. The CCM 200 is electrically connected to the printed circuit board 310 through the lateral contacting fingers 215, the redistribution wire layer 219, the electrically contact components 224, and the external guiding elements 225 so as to minimize the CCM 200.

Figure 4A:
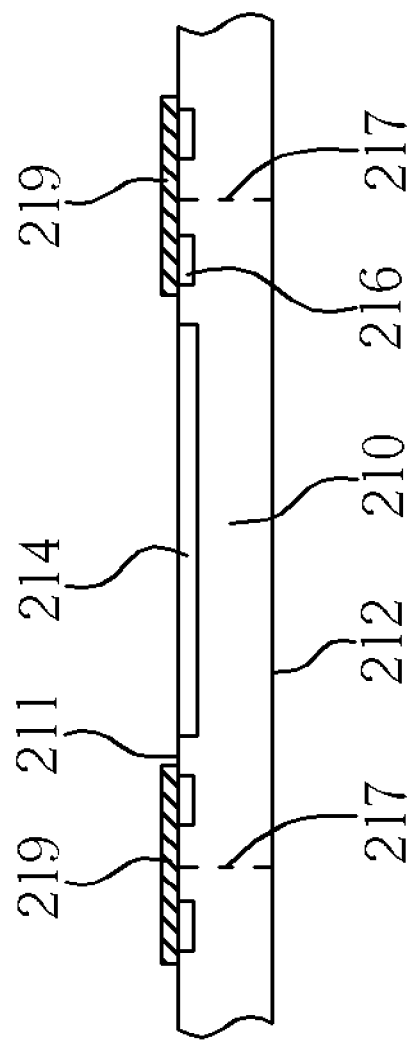
FIGS. 4A-4E are cross-section schematic diagrams of a CCM in fabrication according to an embodiment of the present invention.
Figure 4B:
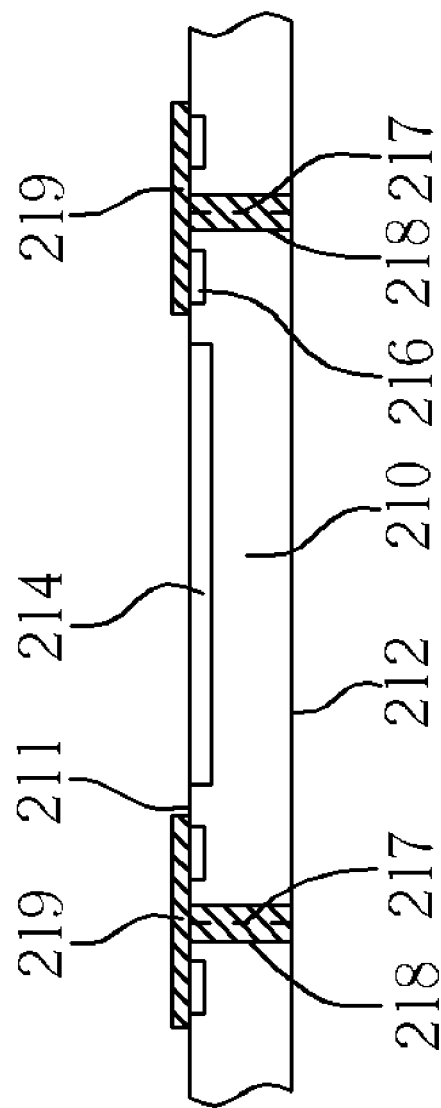
Figure 4C:
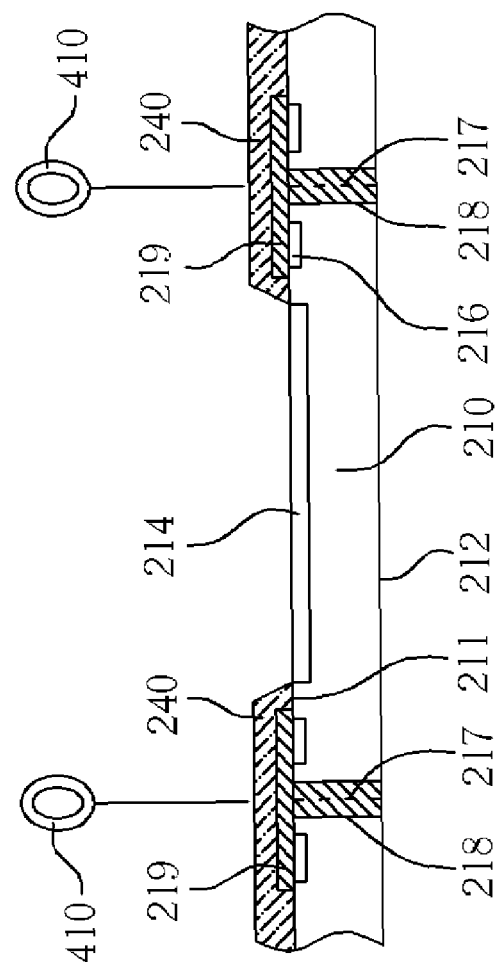
Figure 4D:
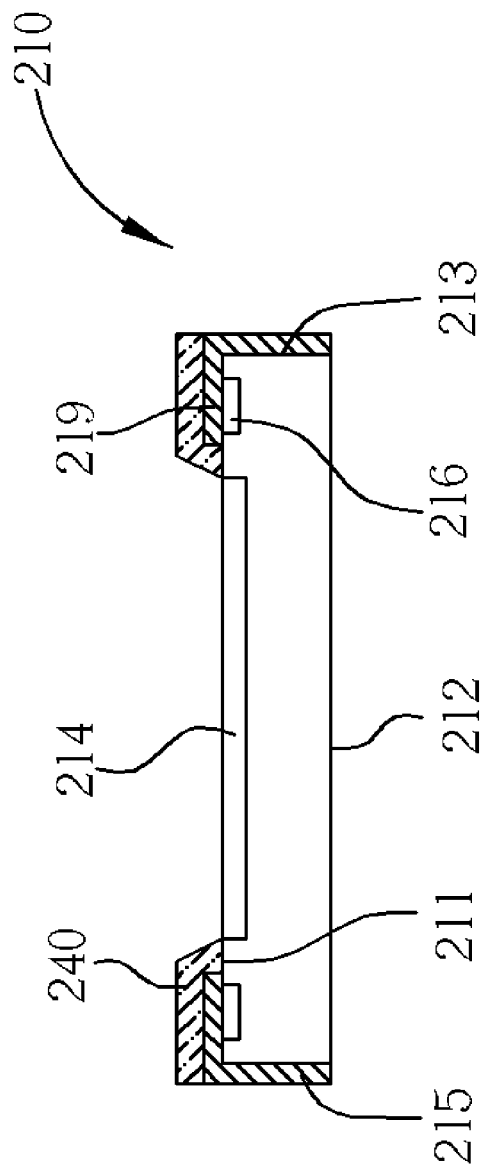

With reference to FIG. 4A to FIG. 4E, the fabrication method of the CCM 200 according to this embodiment is shown. First, as shown in FIG. 4A, at least an image sensor chip 210 is provided. It is monolithically formed in a wafer, which is not shown in the figure. The image sensor chip 210 comprises an active surface 211 and a back surface 212. The image sensor chip 210 also comprises a plurality of bonding pads 216. A sensor region 214 is formed on the active surface 211. A plurality of scribe lines 217 is defined on the wafer. According to this embodiment, the technology of wafer-level redistribution wire process is used to form a redistribution wire layer 219 on the active surface 211 to electrically connect the bonding pads 216. Thereafter, with reference to FIG. 4B, a plurality of through holes 218 is formed in the wafer by laser drilling. These through holes 218 are positioned at the scribe lines 217 and connected to the redistribution wire layer 219. The through holes 218 are filled or electroplated with conductive metals. Then, please refer to FIG. 4C, a protective layer 240 is formed to cover the active surface 211 of the image sensor chip 210 for protecting the redistribution wire layer 219 on the active surface 211 and also to expose the sensor region 214. A scriber 410 is used to cut through the scribe lines 217. Thereafter, please refer to FIG. 4D. The cut image sensor chip 210 comprises a plurality of side surfaces 213 between the active surface 211 and the back surface 212 and a plurality of the lateral contacting fingers 215 formed on the side surfaces 213. These lateral contacting fingers 215 are connected to the redistribution wire layer 219 and electrically connected to the bonding pads 216.

Figure 4E:
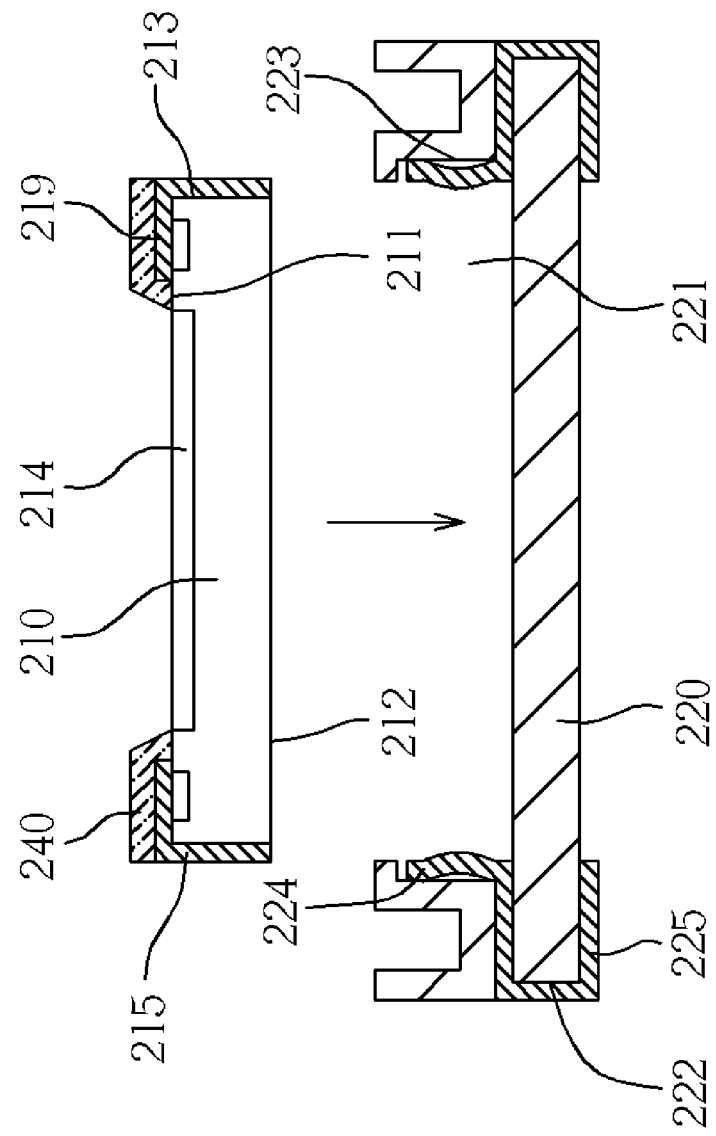

Then please refer to FIG. 4E. A module case 220 that comprises a cave 221 for mounting the image sensor chip 210 is provided. A plurality of electrically contact components 224 is installed on one inside wall 223 of the cave 221. According to this embodiment, the electrically contact components 224 are elastic contact components. It electrically connects the lateral contacting fingers 215 when the image sensor chip 210 is mounted. The module case 220 also comprises a plurality of external guiding elements 225. These external guiding wires 225 are formed on at least one of the external sidewalls 222 of the module case 220. The electrically contact components 224 may be monolithically integrated with the external guiding elements 225 on the module case 220, for example, by electroplating methods. Those external guiding elements 225 extend to the lower surface of the module case 220. Or, the electrically contact components 224 and the external guiding elements 225 may be formed individually to connect with the module case 220. Finally, as shown in FIG. 2, a lens module 230 is mounted to the module case 220. In this embodiment, the lens module 230 comprises a stopper 235 to prevent the image sensor chip 210 from disengaging out of the cave 221. The combination between the lens module 230 and the module case 220 may be achieved by engaging, screwing, or gluing methods. Preferably, an airtight rubber ring 250 is disposed between the lens module 230 and the module case 220, which increases the seal between the lens module 230 and the module case 220. Since the stopper 235 is used to fix the image sensor chip 210 onto the module case 220, the usage of tapes or die bonding materials is waived, so that the image sensor chip 210 have reworking efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A compact camera module (CCM), comprising:
   an image sensor chip having an active surface, a back surface, and a plurality of side surfaces positioned between the active surface and the back surface, a sensor region being formed on the active surface, a plurality of lateral contacting fingers being formed on the side surfaces, and the lateral contacting fingers connecting with a plurality of bonding pads of the image sensor chip;
   a module case comprising a cave where the image sensor chip is disposed, a plurality of electrically contact components being installed on an inside wall of the cave and electrically connecting to the lateral contacting fingers; and
   a lens module mounted to the module case.

2. The CCM of claim 1, wherein the module case further comprises a plurality of external guiding elements.

3. The CCM of claim 2, wherein the external guiding elements are formed on at least one external sidewall of the module case.

4. The CCM of claim 1, wherein the combination between the lens module and the module case is engaging, screwing, or gluing.

5. The CCM of claim 1, wherein a redistribution wire layer is formed on the active surface of the image sensor chip, and the lateral contacting fingers are connected to the bonding pads of the image sensor chip through the redistribution wire layer.

6. The CCM of claim 1, wherein the electrically contact components are elastic contact components.

7. The CCM of claim 1, wherein the lens module comprises a stopper to prevent the image sensor chip from disengaging out of the cave.

8. The CCM of claim 1, wherein the CCM further comprises a protective layer covering the active surface of the image sensor chip.

* * * * *